United States Patent [19]

Proebsting

[11] Patent Number: 5,057,718
[45] Date of Patent: Oct. 15, 1991

[54] CMOS REGENERATIVE SENSE AMPLIFIER WITH HIGH SPEED LATCHING

[75] Inventor: Robert J. Proebsting, Los Altos, Calif.

[73] Assignee: National Semiconductor Corp., Santa Clara, Calif.

[21] Appl. No.: 504,176

[22] Filed: Apr. 3, 1990

[51] Int. Cl.[5] ...................... H03F 3/45; H03K 19/094
[52] U.S. Cl. .................................... 307/530; 307/451; 307/272.1; 307/481
[58] Field of Search ............... 307/443, 448, 451, 530, 307/272.1, 481

[56] References Cited

U.S. PATENT DOCUMENTS

| | | | |
|---|---|---|---|
| 4,649,301 | 3/1987 | Van Tran | 307/530 |
| 4,791,324 | 12/1988 | Hodapp | 307/530 |
| 4,843,264 | 6/1989 | Galbraith | 307/530 |

Primary Examiner—Stanley D. Miller
Assistant Examiner—Margaret Rose Wambach
Attorney, Agent, or Firm—Lee Patch; Robert C. Colwell; Gary T. Aka

[57] ABSTRACT

The present invention provides for a sense amplifier having a pair of input nodes connected through isolating PMOS transistors to the differential input terminals of the amplifier. Each of the input nodes is also connected to the gates of a pair of carefully matched NMOS transistors and to the drain of the other of the matched pair. In addition, each of the input nodes is connected to the gate of one of two drive NMOS transistors. The drains of the drive NMOS transistors are each connected to the gates of two output PMOS transistors, the drains of which form the output terminals of the sense amplifier. The sources of the matched NMOS transistor pair are coupled to ground by a NMOS transistor and the sources of the drive NMOS transistors are coupled to ground by another NMOS transistor. When the differential signals at the input terminals are to be sensed and latched, the sources of matched transistor pair and the sources of the drive transistors are sequentially connected to ground. Thus even though the input nodes of the amplifier are pulled toward ground in a high-speed operation, the input node at the higher voltage is still able to turn on its corresponding drive NMOS transistor. Latching of the sense amplifier proceeds safely.

21 Claims, 1 Drawing Sheet

CMOS REGENERATIVE SENSE AMPLIFIER WITH HIGH SPEED LATCHING

BACKGROUND OF THE INVENTION

This invention relates to sense amplifier circuits useful in CMOS integrated circuits and, more particularly, to regenerative amplifier circuits for quickly and correctly sensing small differential voltage signals.

A problem typically occurs when MOS regenerative sense amplifiers latch differential signals at high speed. For a typical MOS integrated circuit operating between $V_{CC}$ and ground, a fast NMOS latching operation may pull the sense amplifier input node with the high voltage signal down significantly, possibly as far down as $V_{CC}/2$. This creates the possibility that the wrong side of the amplifier may conduct causing an erroneous output.

Furthermore, if the vagaries of semiconductor processing cause an imbalance in the physical parameters of the sense amplifier, the likelihood of improper conduction and latching increases. For example, imbalances in the transconductances, $g_m$, or threshold voltages $V_T$, of the cross-coupled transistors which typically form a latch in the sense amplifier, or in the capacitive loads of the inputs of the sense amplifier, could cause improper conduction and latching.

Imbalances in the initial differential signals itself may also cause problems in high speed latching. High speed sense amplifiers are typically used for reading static random access memory (SRAM) cells and imbalances in such memory cells themselves are possibilities.

The present invention solves or substantially mitigates such problems in high speed latching operations.

SUMMARY OF THE INVENTION

The present invention provides for a sense amplifier having a pair of input nodes connected through isolating MOS transistors to the differential input terminals of the amplifier. Each of the input nodes is also connected to the gate electrode of one of a pair of carefully matched NMOS transistors and to the drain electrodes of the other of the matched pair. In addition, each of the input nodes is connected to the gate electrode of one of two drive NMOS transistors. The drain electrodes of the drive transistors are connected respectively to the gate electrodes of two output transistors, the drain electrodes of which form the output terminals of the sense amplifier.

The source electrodes of the matched NMOS transistor pair are coupled to ground by a NMOS transistor. The source electrodes of the drive NMOS transistors are also coupled to ground by a second NMOS transistor. When the differential signals at the input terminals are to be sensed and latched, the source electrodes of the matched NMOS transistor pair and the source electrodes of the drive NMOS transistors are pulled to ground in a timed relationship. Thus even though the input nodes of the amplifier are pulled toward ground in a high-speed operation, the input node at the higher voltage is still able to turn on its corresponding drive NMOS transistor. Latching of the sense amplifier proceeds safely.

As a safety measure, the sense amplifier has a pair of cross-coupled PMOS transistors, each having a source electrode connected to the high supply voltage, a drain electrode connected to the drain electrode of one of the drive transistors, and a gate electrode connected to the drain electrode of the other cross-coupled PMOS transistor. The cross-coupled PMOS transistors ensure that only one of the output transistors turns on.

DESCRIPTION OF SPECIFIC EMBODIMENTS

Figure 1:
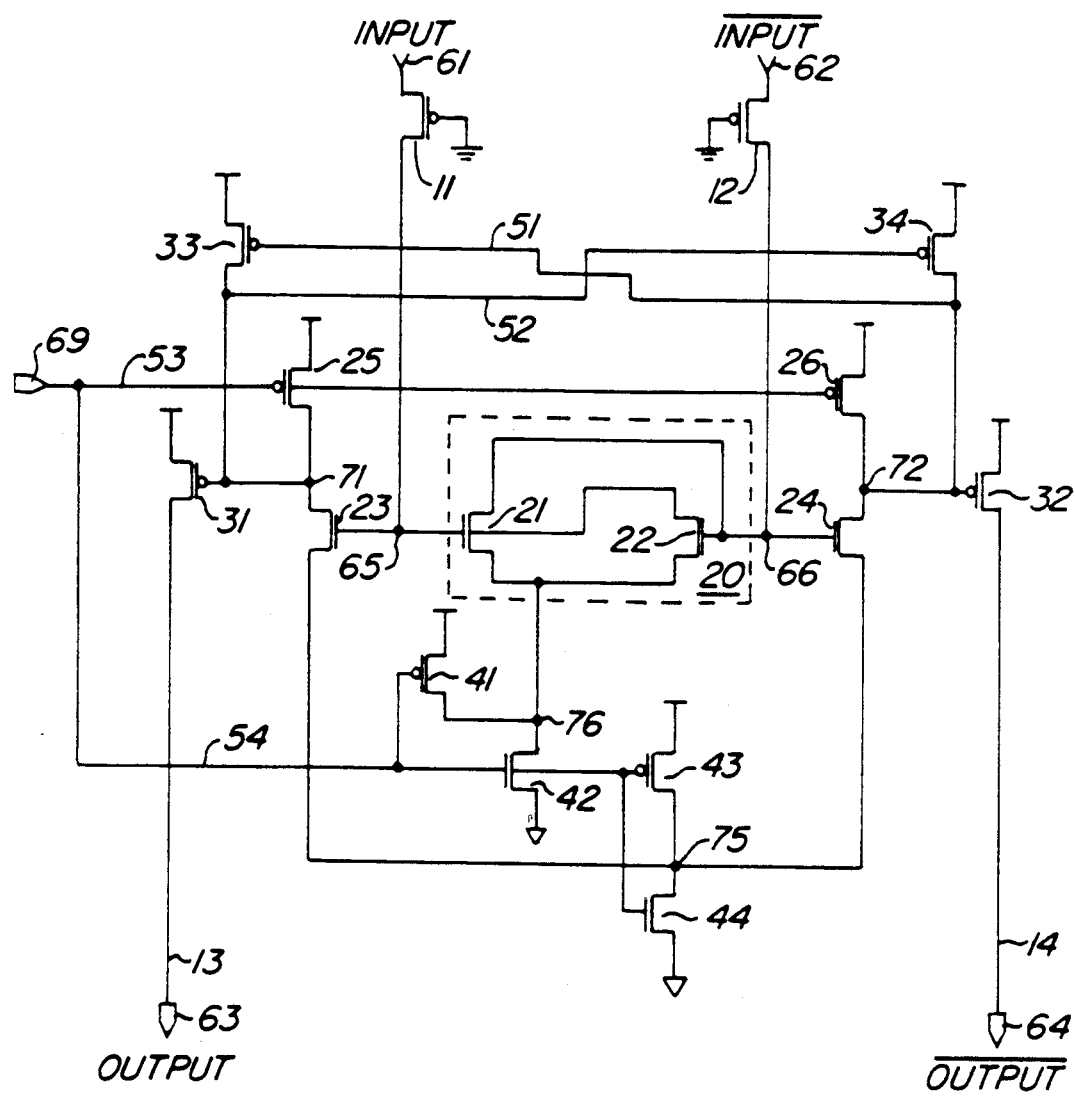
FIG. 1 is a circuit diagram of the present invention.

FIG. 1 is a circuit diagram of the present invention. The circuit has true and complementary input terminals 61, 62 which receive differential voltage signals for sensing. Typically the terminal 61 and the terminal 62 are coupled to the bit line and the complementary bit line, respectively, of an array of static RAM (SRAM) cells. To sense the state of one of the SRAM cells, the selected cell is accessed and a differential voltage starts developing on the bit line and its complement. For high speed operation, there is not time to develop a large differential voltage on the bit lines. Instead, the differential is small, of the order of 0.1 volts, compared to the voltage on the bit lines, which are typically held near the positive supply voltage, $V_{CC}$ (+5 volts) in the present case. The negative supply voltage is ground.

The input terminals 61 and 62 are respectively connected to the source electrodes of PMOS transistors 11 and 12. (In passing, it should be noted that the drawings use the symbol of an MOS transistor with a bubble over the gate to indicate a PMOS transistor.) The drain electrodes of the PMOS transistors 11 and 12 are connected to the input nodes 65 and 66 of a regenerative sense amplifier stage 20, respectively.

The PMOS transistors 11 and 12 serve the function of isolating the capacitances of the bit lines from the latching input nodes 65 and 66 during a sensing operation. The gate electrodes of both transistors 11 and 12 are held low so that the transistors are turned on. While passing voltage signals from the bit lines to the input nodes 65 and 66, the PMOS transistors 11 and 12 present high impedances between the bit lines and the input nodes. Furthermore, while FIG. 1 shows the PMOS transistors 11 and 12 to be permanently on, the gate electrodes of these transistors could be connected to an address decoder as part of column selection in an SRAM array.

The input nodes 65 and 66 of the amplifier stage 20 are connected to two cross-coupled and carefully matched NMOS transistors 21 and 22. The drain electrode of the transistor 21 is connected to the gate electrode of the transistor 22 (and the input node 66) and the drain electrode of the transistor 22 is connected to the gate electrode of the transistor 21 (and the input node 65). The source electrodes of both transistors 21, 22 form a supply voltage node which is connected to a node 76 which is formed by the common drain electrodes of a complementary pair of transistors 41 and 42. The source electrode of the PMOS transistor 41 is connected to the voltage reference at $V_{CC}$, which is typically +5 volts, while the source electrode of the NMOS transistor 42 is connected to a voltage reference at ground. The gate electrodes of both transistors 41, 42 are connected to a control signal terminal 69 by a line 54. The NMOS transistor 42 is large compared to the capacitance at the node 76 so as to able to pull the node 76 down toward ground quickly when the signal at the control terminal 69 goes high.

The input nodes 65 and 66 are respectively connected to the gate electrodes of the NMOS drive transistors 23 and 24 respectively. The source electrodes of both transistors 23 and 24 are connected to a node 75 formed by the common drain electrodes of a complementary pair of transistors 43 and 44. The source electrode of the PMOS transistor 43 is connected to the voltage reference at $V_{CC}$ and the source electrode of the NMOS transistor 44 is connected to the voltage reference at ground. The gate electrodes of both transistors 43 and 44 are connected to the control signal terminal 69 by a line 54. The NMOS transistor 44 is sized smaller relative to the capacitance at the node 75 compared to the size of the transistor 42 relative to the capacitance at the node 76. Thus the drop of the node 75 toward ground lags the drop of the node 76 when the control signal at the terminal 69 goes high. The reason and relationship between the voltage drops at the two nodes 76 and 75 are explained below.

The drain electrodes of the drive transistors 23 and 24 are respectively connected to the drain electrodes of PMOS precharge transistors 25 and 26 and the connections respectively form the nodes 71 and 72. The source electrodes of both PMOS transistor 25 and 26 are connected to the $V_{CC}$ voltage reference and the gate electrodes of both transistors 25 and 26 are connected by a line 53 to the control signal terminal 69.

The nodes 71 and 72 are respectively connected to the gate electrodes of PMOS output transistors 31 and 32. The source electrodes of both transistors 31 and 32 are connected to the $V_{CC}$ supply voltage and the drain electrodes are connected respectively to the output terminals 63 and 64 of the sense amplifier of the present invention.

By well-known practices in the integrated circuit design art, the output lines connected to the output terminals 63 and 64 are held near ground by NMOS transistors when the sense amplifier is not in operation. For a sensing operation, the NMOS transistors release the output lines so that one of the output terminals 63 or 64 can go high for a differential output signal.

The nodes 71 and 72 are also respectively connected to the drain electrodes of PMOS transistors 33 and 34, which are cross-coupled. A line 51 connects the gate electrode of the transistor 33 to the drain electrode of the transistor 34 and a line 52 connects the gate electrode of the transistor 34 to the drain electrode of the transistor 33. As explained below, the PMOS transistors 33 and 34 are not required if the circuit of the present invention is implemented ideally. In theory, the two transistors 33 and 34 may be deleted without an adverse effect of the sense amplifier of the present invention.

Prior to the initiation of a sensing operation, the control signal on the terminal 69 is low, 0 volts or ground. Both PMOS transistors 25 and 26 are on to "precharge" the nodes 71 and 72 to $V_{CC}$. Both the nodes 71 and 72 are high and the PMOS output transistors 31 and 32 are off. Provision (not shown) is made to discharge the output terminals 63 and 64 to ground at this time. Both input nodes 65 and 66 are pulled high by the high voltage of the bit line and its complement acting through the PMOS transistors 11 and 12 respectively.

The sense amplifier is engaged after one of the SRAM cells of the array is selected for a sensing operation. The state of the selected cell appears as a small differential voltage between the bit line and its complement, both nominally near the +5 volt potential of VCC. The bit line voltage passes through the input terminal 61 and the PMOS transistor 11 to the input 65. Likewise, the complementary bit line voltage passes through the input terminal 62 and the PMOS transistor 12 to the input node 66. Thus the differential voltage appears at the input nodes 65 and 66 for sensing.

The signal at the control terminal 69 now goes high. The PMOS transistors 25 and 26 are turned off. This frees the nodes 71 and 72, which were kept high by the action of the transistors 25 and 26.

Figure 2:
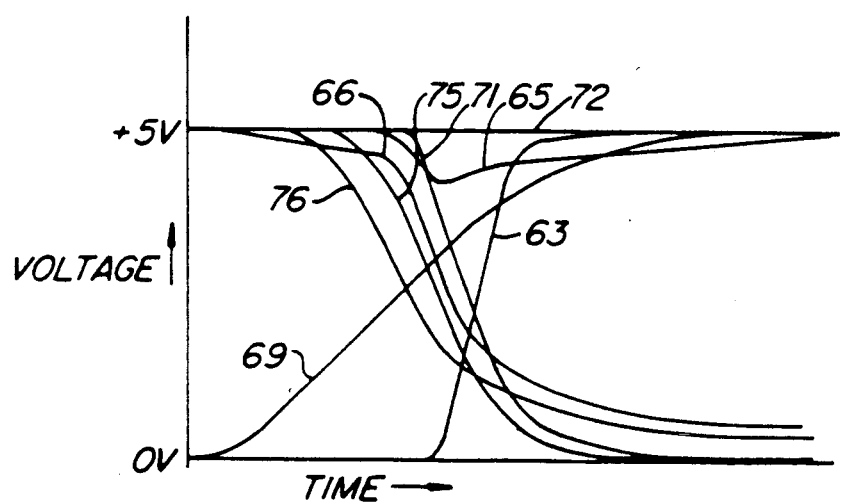
FIG. 2 is a timing diagram of the operation of the circuit shown in FIG. 1.

Reference is now made to the illustrative timing diagrams of FIG. 2. In this example it is assumed that the differential voltage signal from the bit line and its complement has the input node 65 in the high state and the input node 66 in the low state. As explained previously the voltage differential is very small, about 0.1 volts.

The high transition at the control signal terminal 69 turns on the NMOS transistor 42, which rapidly pulls the node 76 toward ground. Transistor 41 turns off so it does not interfere with the operation of transistor 42. As described below, transistor 41 is not required by the latching operation. The cross-coupled NMOS transistors 21 and 22 turn on and begin their regenerative action Since the input node 65 (and the gate electrode of the transistor 21) is at a higher voltage than the input node 66 (and the gate electrode of the transistor 22) and since the source electrodes are both at the same voltage, the transistor 21 draws more current from the input node 66 than does the transistor 22 from the input node 65. The node 66 falls faster than the node 65, increasing the voltage differential as desired.

At this point it should be noted the beneficial action of the PMOS transistors 11 and 12. If these transistors were not present, the input nodes 65 and 66 would be directly connected to the bit line and its complement respectively. Bit lines (and their complements) have very much larger capacitances than the input nodes of sense amplifiers. In a realization of the present invention, a bit line has a capacitance of approximately 1 pF, while an input node has a capacitance of approximately 0.1 pF. Thus a direct connection of the input nodes 65 and 66 to a bit line and its complement results in a very slow sensing operation. A long time is required before the transistors 21 or 22 can discharge the large amount of charge on the bit line or its complement for the latching of the two transistors to be completed.

The PMOS transistors 11 and 12 separate the large capacitance of the bit lines from the input nodes by providing a large effective impedance between a bit line (or a complementary bit line) and a discharging input node. Thus the voltage on the input nodes 65 or 66 can drop, while the voltages on the bit lines and their complements remain high.

As the node 76 is pulled to ground, two effects occur which effect the transistors 21 and 22. The first affect is wrongside conduction. For high speed operation, the node 76 should be pulled to ground quickly as shown in FIG. 2. If such is done, then the voltage difference between the source and gate electrodes of both transistors 21 and 22 increase. Invariably for both transistors 21 and 22, the gate-to-source voltage exceeds $V_T$, the threshold voltage of the transistors. Both transistors 21 and 22 are turned on. For the transistor receiving the more positive differential voltage at its gate, in the example of FIG. 2 the transistor 21, this is no problem. The transistor should be on. But for the transistor receiving the less positive voltage, transistor 22 in this case, this is not desirable. With the transistor 22 on, charge is also removed from the input node 65 and the node 65 also falls to slow the latching of the two transistors 21 and 22. This undesirable conduction through the transistor 22 ceases when the transistor 21 pulls the node 66 sufficiently low to turn off the transistor 22.

The second effect is the capacitive coupling between the gate electrode and the source/drain electrodes of both transistors 21 and 22. As the node 76 falls, the source electrodes of both transistors also fall, capacitively pulling down the gate electrodes and both input nodes 65 and 66. For the low node 66 this is no problem because it should move to ground. For the high node 65, this is a problem because ideally it should remain at a high voltage. Again latching is slowed.

The result of the two effects on the node 65 is shown in FIG. 2 as a dip in the voltage. The voltage on the node 65 remains high enough to pull the node 66 to near the ground reference potential.

The present invention provides for the NMOS transistors 23 and 24 to ensure a high speed operation. With the signal at the control terminal 69 going high, the NMOS transistor 44 turns on while the PMOS transistor 43 (if present) turns off to pull the node 75 low. This action also pulls the source electrodes of the NMOS transistors 23 and 24 low. The node 75 is engineered to move slowly enough that the voltage difference between the gate electrode and the source electrode of the drive transistor (24, in this example), which is receiving the lower differential voltage at the input node 66, does not turn on. The drive transistor 23 turns on even though the input node 65 dips due to wrongside conduction and capacitive coupling, as explained previously. With the drive transistor 23 turning on, the node 71 is pulled low, as shown in FIG. 2, to turn on the PMOS output transistor 31. The voltage at the output terminal 63 rises.

Ideally the drive transistor receiving the lower differential voltage, in this case the drive transistor 24, should not turn on with the fall of the node 75. This is done by moderating the fall of the node 75 with respect to the fall of the node 76 so that voltage difference between the source electrode and the gate electrode of the drive transistor receiving the lower differential voltage, here the transistor 24, does not exceed the threshold voltage $V_T$. As stated previously, the control of the rate of the node 75 fall with respect to the node 76 fall when the terminal 69 goes high is controlled by the proper sizing of the transistors 42 and 44 with respect to the nodes 76 and 75.

However, the uncertainties in semiconductor processing, such as in the operational characteristics of the transistors, the matching of the operational characteristics of the transistors and the capacitive loads at the various nodes of the circuit make reliance upon an ideal timing between the fall of the nodes 76 and 75 risky in an actual device. One alternative is to delay the fall of the node 75 until the sensing by transistors 21 and 22 is complete, but this would delay the final output.

Another alternative is provided by the PMOS transistors 33 and 34. These transistors ensure that even if the drive transistor receiving the lower differential voltage (transistor 24 in this example) turns on, the node 72 is held high to prevent the PMOS output transistor 32 from turning on. In the example of FIG. 2, the higher voltage at the input node 65 turns on the drive transistor 23 before the drive transistor 24 which ideally should remain off as the node 75 falls. This forces the node 71 to fall. By the line 52 the low voltage on the node 71 turns on the PMOS transistor 34 to hold the node 72 high. Thus even if the drive transistor 24 is somewhat turned on, the PMOS output transistor 32 stays off. The PMOS transistors 33 and 34 provide a safety margin for the vagaries of semiconductor processing.

It should be noted here that the PMOS transistors 41 and 43, which are used to restore the source electrodes of the transistors 21 and 22, and the transistors 23 and 24 respectively, to $V_{CC}$ after a sensing operation, are not strictly required. For example, after a sensing operation the control signal at the terminal 69 returns low and the NMOS transistors 42 and 44 are turned off. Even without the presence of the PMOS transistor 41, the node 76 rises from the conduction of the cross-coupled transistors 21 and 22. The node 76 is charged by the current through the transistor 21 from the input node 66 and by the current through the transistor 22 from the input node 65. Even though both nodes 65 and 66 carry a differential signal, both nodes are returning to near $V_{CC}$. The node 76 rises to approximately $V_{CC} - V_T$, $V_T$ being the threshold voltage of the transistors 21 and 22, at which point both transistors 21 and 22 turn off.

Likewise, the PMOS transistor 43 is not strictly required for the recovery of the node 75 after sensing. Even without the PMOS transistor 43, one or both of the transistors 23 and 24 conducts current from the nodes 71 and 72 (which are high due to the precharging action of the PMOS transistors 25 and 26 respectively) to the node 75 until the node is charged up to $V_{CC} - V_T$, $V_T$ being the threshold voltage of the transistors 23 and 24.

The advantage of the PMOS transistors 41 and 43 is the quick recovery of the sense amplifier after a sensing operation. As explained above, without the transistor 41 the cross-coupled transistors 21 and 22 remain on until the node 76 rises sufficiently to turn the transistors off. Assume the circuit is recovering form the sensing operation described earlier, in which the node 65 was at the higher voltage than was the node 66. Now with the node 65 higher than the node 66, more current to charge the node 76 comes through the transistor 21 than comes through the transistor 22. Current through the transistor 21 tries to pull the node 66 low at the very time we are trying to equilibrate the voltages on the nodes 65 and 66 (and on the input terminals 61 and 62). That is, this differential current slows down the equilibration process.

Similarly the PMOS transistor 43 pulls the node 75 up quickly to turn off one or both of the drive transistors 23 and 24 for a fast equilibration of the nodes 71 and 72. The sense amplifier is ready for the next sensing operation.

It should be further noted that the PMOS transistor 41 also may be used to delay the fall of the node 76 when the control signal 69 starts to go high and that PMOS transistor 43 may be used to similarly delay the fall of the node 75.

The present invention has proved effective in practice. In integrated circuits having process parameters of 1.0 micron linewidths, and channel lengths of 0.9 microns, the present sense amplifier has operated securely in high speed operations in which the regenerative sense amplifier stage has been pulled low in 200 picoseconds. Additionally even with the high voltage signal of the differential signal being pulled below $V_{CC}/2$, the sense amplifier can operate securely. The only effect is to lengthen the time for the sense amplifier to latch, i.e., the access time is increased.

While the above is a complete description of the preferred embodiments of the invention, various alternatives, modifications and equivalents may be used. For example, the present invention has been described in the context of an MOS integrated circuit. It should be evident that the present invention is equally applicable in the MOS portion of a BiCMOS integrated circuit by making appropriate modifications. Furthermore, the circuit described herein may be modified by reversing the polarities of transistors of the circuit, along with the polarities of the voltage references, without departing from the present invention. Additionally, while the circuit of the present invention has been described in terms of a single control signal emanating from a single terminal, a plurality of control signals having the functions and timing relations described above would work equally well. Therefore, the above description should not be taken as limiting the scope of the invention which is defined by the appended claims.

What is claimed is:

1. A MOS sense amplifier having a pair of differential input terminals and a pair of differential output terminals, comprising:
   a pair of cross-coupled transistors, each transistor having a gate electrode connected to a drain electrode of the other transistor, a source electrode connected to the source electrode of the other cross-coupled transistor to form a first common node;
   means for connecting one input terminal to the gate electrode of one of the cross-coupled transistors, and for connecting the other input terminal to the gate electrode of the other cross-coupled transistor;
   a first latching transistor having a drain electrode connected to the first common node, a source electrode connected to a first voltage reference, and a gate electrode connected to a first control signal node;
   a pair of drive transistors, each transistor having a gate electrode connected to the gate electrode of one of the cross-coupled transistors respectively, a source electrode connected to the source electrode of the other drive transistor to form a second common node, and a drain electrode;
   a second latching transistor having a drain electrode connected to the second common node, a source electrode connected to the first voltage reference, and a gate electrode connected to a second control signal node;
   a pair of precharge transistors, each transistor having a drain electrode connected to the drain electrode of one of the drive transistors respectively, a gate electrode connected to a third control signal node, and a source electrode connected to a second voltage reference; and
   a pair of output transistors, each transistor having a source electrode connected to the second voltage reference, a gate electrode connected to the drain electrode of one of the drive transistors respectively, and a drain electrode connected to one of the output terminals respectively;
   whereby said sense amplifier generates a high speed output signal at the output terminals upon related sensing operation signals on the first, second and third control signal nodes.

2. The sense amplifier of claim 1 further comprising a second pair of cross-coupled transistors, each transistor having a source electrode connected to the second voltage reference, a drain electrode connected to the drain electrode of one of the drive transistors, and a gate electrode connected to the drain electrode of the other cross-coupled transistor.

3. The sense amplifier of claim 1 further comprising a first recovery transistor having a source electrode connected to the second voltage reference, a gate electrode connected to the first control signal node, and a drain electrode connected to the first common node.

4. The sense amplifier of claim 1 further comprising a second recovery transistor having a source electrode connected to the second voltage reference, a gate electrode connected to the second control signal node, and a drain electrode connected to the second common node.

5. The sense amplifier of claim 2 further comprising a first recovery transistor having a source electrode connected to the second voltage reference, a gate electrode connected to the first control signal node, and a drain electrode connected to the first common node.

6. The sense amplifier of claim 2 further comprising a second recovery transistor having a source electrode connected to the second voltage reference, a gate electrode connected to the second control signal node, and a drain electrode connected to the second common node.

7. The sense amplifier of claim 5 further comprising a second recovery transistor having a source electrode connected to the second voltage reference, a gate electrode connected to the second control signal node, and a drain electrode connected to the second common node.

8. The sense amplifier of claim 3 further comprising a second recovery transistor having a source electrode connected to the second voltage reference, a gate electrode connected to the second control signal node, and a drain electrode connected to the second common node.

9. The sense amplifier of claim 1 wherein the connecting means comprises a pair of resistive means, each resistive means connecting respectively one input terminal to the gate electrode of one of the cross-coupled transistors and connecting the other input terminal to the gate electrode of the other cross-coupled transistor.

10. The sense amplifier of claim 9 wherein the pair of resistive means comprises a pair of transistors, each transistor having a source electrode connected to one of the input terminals and a drain electrode connected to the gate electrode of one of the cross-coupled transistors, each transistor providing a resistance between its respective input terminal and gate electrode during a sensing operation.

11. The sense amplifier of claim 10 wherein each of the transistor pair has a gate electrode, the gate electrode of each transistor connected to the first voltage reference.

12. The sense amplifier of claim 10 wherein each of the transistor pair has a gate electrode, the gate electrode of each transistor connected to an address decoder.

13. The sense amplifier of claim 1 wherein the first, second and third control signal nodes are connected to a control signal terminal.

14. The sense amplifier of claim 13 further comprising a second pair of cross-coupled transistors, each transistor having a source electrode connected to the second voltage reference, a drain electrode connected to the drain electrode of one of the drive transistors, and a gate electrode connected to the drain electrode of the other cross-coupled transistor.

15. The sense amplifier of claim 14 further comprising a first recovery transistor having a source electrode connected to the second voltage reference, a gate electrode connected to the control terminal, and a drain electrode connected to the first common node.

16. The sense amplifier of claim 14 further comprising a second recovery transistor having a source electrode connected to the second voltage reference, a gate electrode connected to the control terminal, and a drain electrode connected to the second common node.

17. The sense amplifier of claim 15 further comprising a second recovery transistor having a source electrode connected to the second voltage reference, a gate electrode connected to the control terminal, and a drain electrode connected to the second common node.

18. In a MOS sense amplifier having a pair of differential input terminals a pair of differential output terminals a pair of cross-coupled transistors, each transistor having a gate electrode connected to a drain electrode of the other transistor, a source electrode connected to the source electrode of the other cross-coupled transistor to form a first common node; means for connecting one input terminal to the gate electrode of one of the cross-coupled transistors, and for connecting the other input terminal to the gate electrode of the other cross-coupled transistor; a first latching transistor having a drain electrode connected to the first common node, a source electrode connected to a first voltage reference, and a gate electrode connected to a first control signal node; a pair of drive transistors, each transistor having a gate electrode connected to the gate electrode of one of the cross-coupled transistors respectively, a source electrode connected to the source electrode of the other drive transistor to form a second common node, and a drain electrode; a second latching transistor having a drain electrode connected to the second common node, a source electrode connected to the first voltage reference, and a gate electrode connected to a second control signal node; a pair of precharge transistors, each transistor having a drain electrode connected to the drain electrode of one of the drive transistors respectively, a gate electrode connected to a third control signal node, and a source electrode connected to a second voltage reference; and a pair of output transistors, each transistor having a source electrode connected to the second voltage reference, a gate electrode connected to the drain electrode of one of the drive transistors respectively, and a drain electrode connected to one of the output terminals respectively;

the method of generating a high speed output signal at the output terminals comprising:
generating a control signal at the third control signal node to turn of the precharge transistors;
generating a control signal at the first control signal node to turn on the first latching transistors; and
generating a control signal at the second control signal node to turn on the second latching transistor in a manner that the second common node falls slowly enough toward the first voltage reference such that the voltage difference between the source electrode and the gate electrode of the drive transistor with the lower differential voltage at its gate electrode, is sufficiently small to keep the drive transistor from turning on.

19. In a MOS sense amplifier having a pair of differential input terminals; a pair of differential output terminals; a pair of cross-coupled transistors, each transistor having a gate electrode connected to a drain electrode of the other transistor, a source electrode connected to the source electrode of the other cross-coupled transistor to form a first common node; means for connecting one input terminal to the gate electrode of one of the cross-coupled transistors, and for connecting the other input terminal to the gate electrode of the other cross-coupled transistor; a first latching transistor having a drain electrode connected to the first common node, a source electrode connected to a first voltage reference, and a gate electrode connected to a first control signal node; a pair of drive transistors, each transistor having a gate electrode connected to the gate electrode of one of the cross-coupled transistors respectively, a source electrode connected to the source electrode of the other drive transistor to form a second common node, and a drain electrode; a second latching transistor having a drain electrode connected to the second common node, a source electrode connected to the first voltage reference, and a gate electrode connected to a second control signal node; a pair of precharge transistors, each transistor having a drain electrode connected to the drain electrode of one of the drive transistors respectively, a gate electrode connected to a third control signal node, and a source electrode connected to a second voltage reference; and a pair of output transistors, each transistor having a source electrode connected to the second voltage reference, a gate electrode connected to the drain electrode of one of the drive transistors respectively, and a drain electrode connected to one of the output terminals respectively;

the method of generating a high speed output signal at the output terminals comprising:
generating a control signal at the third control signal node to turn off the precharge transistors;
generating a control signal at the first control signal node to turn on he first latching transistor;
generating a control signal at the second control signal node to turn on the second latching transistor in a manner that the second common node falls slowly enough toward the first voltage reference such that the voltage difference between the source electrode and the gate electrode of the drive transistor with the lower differential voltage at its gate electrode, is sufficiently small to keep the drive transistor from turning on; and
holding the drain electrode of the drive transistor with the gate electrode receiving the lower differential voltage near the second voltage reference responsive to a higher differential voltage at the gate electrode of the other cross-coupled transistor, to ensure that the output transistor connected to the drive transistor with the gate electrode receiving the lower differential voltage, has a low enough gate-to-source voltage to keep the output transistor from turning on.

20. The method of claim 18 wherein the signals for the third control signal node, the first control signal node, the second control signal node are generated at substantially the same time.

21. The method of claim 19 wherein the signals for the third control signal node, the first control signal node, and the second control signal node are generated at substantially the same time.

* * * * *